(12) United States Patent
Wei et al.

(10) Patent No.: US 11,949,422 B2
(45) Date of Patent: Apr. 2, 2024

(54) PULSE WIDTH MODULATION CIRCUIT, METHOD FOR PULSE WIDTH MODULATION, AND ELECTRONIC DEVICE

(71) Applicants: Beijing BOE Technology Development Co., Ltd., Beijing (CN); BOE Technology Group Co., Ltd., Beijing (CN)

(72) Inventors: Xiangye Wei, Beijing (CN); Liming Xiu, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 156 days.

(21) Appl. No.: 17/642,023

(22) PCT Filed: Mar. 9, 2021

(86) PCT No.: PCT/CN2021/079750
§ 371 (c)(1),
(2) Date: Mar. 10, 2022

(87) PCT Pub. No.: WO2021/208640
PCT Pub. Date: Oct. 21, 2021

(65) Prior Publication Data
US 2022/0376687 A1    Nov. 24, 2022

(30) Foreign Application Priority Data
Apr. 14, 2020   (CN) .......................... 202010291639.5

(51) Int. Cl.
*H03K 7/08*       (2006.01)
*H03K 3/017*      (2006.01)

(52) U.S. Cl.
CPC ............... *H03K 7/08* (2013.01); *H03K 3/017* (2013.01)

(58) Field of Classification Search
CPC .................................. H03K 3/017; H03K 7/08
See application file for complete search history.

(56) References Cited

U.S. PATENT DOCUMENTS 6,765,422 B1 * 7/2004 Aslan ....................... H03K 7/08
                                                          327/124
8,664,988 B1    3/2014 Xiu
(Continued)

FOREIGN PATENT DOCUMENTS

CN    101107887 A    1/2008
CN    102625527 A    8/2012
(Continued)

OTHER PUBLICATIONS

Mair, Hugh, and Liming Xiu. "An architecture of high-performance frequency and phase synthesis." IEEE Journal of Solid-State Circuits 35.6 (2000): 835-846.
(Continued)

*Primary Examiner* — David B Lugo
(74) *Attorney, Agent, or Firm* — IPro, PLLC

(57) ABSTRACT

A pulse width modulation (PWM) circuit, a method for PWM, and an electronic device are provided. In the PWM circuit, a control word providing circuit can generate, based on an obtained target duty cycle, two target frequency control words with a ratio of the target duty cycle, and output the two target frequency control words to a pulse generation circuit, wherein a ratio of the first target frequency control word to the second target frequency control word is the target duty cycle; and the pulse generation circuit can output a target pulse signal with the target duty cycle under the control of the two target frequency control words.

20 Claims, 7 Drawing Sheets

(56) References Cited

U.S. PATENT DOCUMENTS

| | | |
|---|---|---|
| 9,008,261 B2 | 4/2015 | Xiu |
| 9,036,755 B2 | 5/2015 | Xiu |
| 2004/0120395 A1* | 6/2004 | Orr .................. H02M 3/157 |
| | | 375/237 |
| 2011/0121869 A1 | 5/2011 | Gelfand et al. |
| 2019/0261472 A1 | 8/2019 | Xiu |

FOREIGN PATENT DOCUMENTS

| | | |
|---|---|---|
| CN | 108668399 A | 10/2018 |
| CN | 109714032 A | 5/2019 |
| CN | 111327301 A | 6/2020 |

OTHER PUBLICATIONS

CN202010291639.5 first office action.
CN202010291639.5 Notification to Grant Patent Right for Invention.

\* cited by examiner

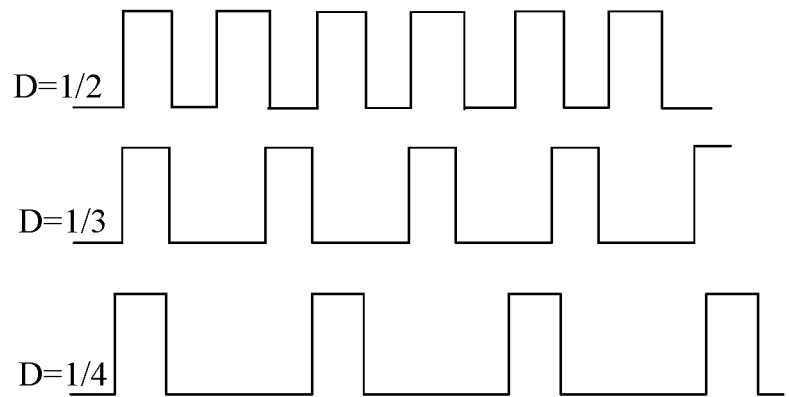

FIG. 10

| Obtaining, by a control word providing circuit, a target duty cycle, generating a first target frequency control word and a second target frequency control word based on the target duty cycle, and outputting the first target frequency control word and the second target frequency control word to a pulse generation circuit | 1101 |

| Outputting, by the pulse generation circuit in response to the first target frequency control word and the second target frequency control word, a target pulse signal whose duty cycle is the target duty cycle | 1102 |

FIG. 11

PULSE WIDTH MODULATION CIRCUIT, METHOD FOR PULSE WIDTH MODULATION, AND ELECTRONIC DEVICE

CROSS-REFERENCE TO RELATED APPLICATION

The present application is a 371 of PCT Patent Application Serial No. PCT/CN2021/079750, filed on Mar. 9, 2021, which claims priority to Chinese Patent Application No. 202010291639.5, filed on Apr. 14, 2020, and entitled "PULSE WIDTH MODULATION CIRCUIT, MODULATION METHOD, AND ELECTRONIC DEVICE", both of which are incorporated herein by reference in their entirety.

TECHNICAL FIELD

The present disclosure relates to the field of communication technologies, and in particular, to a pulse width modulation (PWM) circuit, a method for PWM, and an electronic device.

BACKGROUND

PWM is a way of digitally encoding an analog signal level to generate a pulse signal, and is widely used in fields such as measurement and communication.

SUMMARY

The present disclosure provides a PWM circuit, a method for PWM, and an electronic device. The technical solutions are as follows.

According to an aspect, a PWM circuit is provided. The PWM circuit includes a control word providing circuit and a pulse generation circuit, and the control word providing circuit is connected to the pulse generation circuit;

the control word providing circuit is configured to: obtain a target duty cycle, generate a first target frequency control word and a second target frequency control word based on the target duty cycle, and output the first target frequency control word and the second target frequency control word to the pulse generation circuit, wherein a ratio of the first target frequency control word to the second target frequency control word is the target duty cycle; and the pulse generation circuit is configured to output, in response to the first target frequency control word and the second target frequency control word, a target pulse signal whose duty cycle is the target duty cycle.

Optionally, the pulse generation circuit includes a comparison sub-circuit, a pulse generation sub-circuit and an output selection sub-circuit;

the comparison sub-circuit is respectively connected to the control word providing circuit, the pulse generation sub-circuit and the output selection sub-circuit, the control word providing circuit is configured to output the first target frequency control word and the second target frequency control word to the comparison sub-circuit; and the comparison sub-circuit is configured to: determine whether the first target frequency control word is equal to the second target frequency control word; if the first target frequency control word is not equal to the second target frequency control word, output the first target frequency control word and the second target frequency control word to the pulse generation sub-circuit and output a first control signal to the output selection sub-circuit; and the first target frequency control word is equal to the second target frequency control word, output a second control signal to the output selection sub-circuit;

the pulse generation sub-circuit is connected to the output selection sub-circuit, and the pulse generation sub-circuit is configured to: generate the target pulse signal and output the target pulse signal to the output selection sub-circuit in response to the first target frequency control word and the second target frequency control word; and the output selection sub-circuit is configured to: output, in response to the first control signal, the target pulse signal provided by the pulse generation sub-circuit, and output, in response to the second control signal, a target pulse signal whose duty cycle is 1.

Optionally, the control word providing circuit includes a controller and a memory, the memory stores a plurality of control word pairs, each of the control word pairs includes a first candidate frequency control word and a second candidate frequency control word, and a ratio of the first candidate frequency control word to the second candidate frequency control word comprised in any one of the control word pairs is different from a ratio of the first candidate frequency control word to the second candidate frequency control word comprised in any other control word pair;

the controller is connected to the memory, and the controller is configured to determine, based on the target duty cycle, a target control word pair from the plurality of control word pairs stored in the memory, wherein a ratio of a first candidate frequency control word to a second candidate frequency control word included in the target control word pair is the target duty cycle; and the controller is further configured to: determine the first candidate frequency control word included in the target control word pair as the first target frequency control word, and determine the second candidate frequency control word included in the target control word pair as the second target frequency control word.

Optionally, the memory has a plurality of storage areas, each of the storage areas stores one control word pair, and control word pairs stored in different storage areas are different; and the controller is configured to: determine an address of a target storage area from the plurality of storage areas based on the target duty cycle, and obtain the target control word pair from the target storage area based on the address of the target storage area, wherein the address A of the target storage area satisfies: $A = A1 + D/r$, $A1$ is a reference address, $D$ is the target duty cycle, and $r$ is a resolution of the target duty cycle.

Optionally, the pulse generation sub-circuit includes an initial pulse generation module and a target pulse generation module;

the initial pulse generation module is connected to the target pulse generation module, and the initial pulse generation module is configured to: generate a plurality of initial pulses and output the plurality of initial pulses to the target pulse generation module, wherein a phase difference between any two adjacent initial pulses is the same; and the target pulse generation module is further respectively connected to the comparison sub-circuit and the output selection sub-circuit, and the target pulse generation module is configured to: generate the target pulse signal whose duty cycle is the target duty cycle based on the plurality of initial pulses, and the first target frequency control word and the second target frequency control word that are output by the comparison sub-circuit, and output the target pulse signal to the output selection sub-circuit.

Optionally, the target pulse generation module includes an input unit, a selection unit and an output unit;

the input unit is respectively connected to the control word providing circuit and the selection unit, and the input unit is configured to output a selection control signal to the selection unit based on the first target frequency control word and the second target frequency control word;

the selection unit is further respectively connected to the initial pulse generation module and the output unit, and the selection unit is configured to: select an initial candidate pulse from the plurality of initial pulses in response to the selection control signal, and output the initial candidate pulse to the output unit; and the output unit is further connected to the output selection sub-circuit, and the output unit is configured to: generate the target pulse signal based on the initial candidate pulse, and output the target pulse signal to the output sub-circuit.

Optionally, the input unit includes: a first register, a second register, a third register, a fourth register, a first adder, and a second adder; the selection unit includes: a first selector, a second selector, and a third selector; and the output unit includes: a D flip-flop, a first inverter, and a second inverter;

the first adder and the second adder are connected to the control word providing circuit and the third register, respectively, the first adder, the first register, the second register and the first selector are sequentially connected, the second adder, the third register, the fourth register and the second selector are sequentially connected, the second register is further connected to a first clock signal terminal, and the first register, the third register and the fourth register are further respectively connected to a second clock signal terminal;

the first adder is configured to: add the first target frequency control word and information stored in the third register, and store a summation result in the first register at a rising edge of a second clock signal provided by the second clock signal terminal connected to the first register; the second register is configured to: store the summation result stored in the first register at a rising edge of a first clock signal provided by the first clock signal terminal connected to the second register, and output the summation result to the first selector; the second adder is configured to: add the second target frequency control word and the information stored in the third register, and store a summation result in the third register at the rising edge of the second clock signal provided by the second clock signal terminal connected to the third register; and the fourth register is configured to: store the summation result stored in the third register at the rising edge of the first clock signal provided by the first clock signal terminal connected to the fourth register, and output the summation result to the second selector;

the first selector and the second selector are further connected to the initial pulse generation module and the third selector, respectively, and the third selector is further connected to the first clock signal terminal and a first input terminal of the D flip-flop;

the first selector is configured to: select a first candidate pulse from the plurality of initial pulses in response to the summation result output by the second register, and output the first candidate pulse to the third selector; the second selector is configured to: select a second candidate pulse from the plurality of initial pulses in response to the summation result output by the fourth register, and output the second candidate pulse to the third selector; and the third selector is configured to: select one of the first candidate pulse and the second candidate pulse as the initial candidate pulse at the rising edge of the first clock signal provided by the first clock signal terminal connected to the third selector, and output the initial candidate pulse to the D flip-flop; and a second input terminal of the D flip-flop is connected to an output terminal of the first inverter, an input terminal of the first inverter and an input terminal of the second inverter are both connected to an output terminal of the D flip-flop, and the D flip-flop is configured to: generate the target pulse signal based on the initial candidate pulse and output the target pulse signal to the output selection sub-circuit.

Optionally, both the first target frequency control word and the second target frequency control word are positive integers.

According to another aspect, a method for PWM is provided. The method includes:

obtaining, by a control word providing circuit, a target duty cycle, generating a first target frequency control word and a second target frequency control word based on the target duty cycle, and outputting the first target frequency control word and the second target frequency control word to a pulse generation circuit, wherein a ratio of the first target frequency control word to the second target frequency control word is the target duty cycle; and outputting, by the pulse generation circuit in response to the first target frequency control word and the second target frequency control word, a target pulse signal whose duty cycle is the target duty cycle.

Optionally, the pulse generation circuit includes: a comparison sub-circuit, a pulse generation sub-circuit and an output selection sub-circuit; outputting the first target frequency control word and the second target frequency control word to the pulse generation circuit includes:

outputting the first target frequency control word and the second target frequency control word to the comparison sub-circuit; and outputting, by the pulse generation circuit in response to the first target frequency control word and the second target frequency control word, the target pulse signal whose duty cycle is the target duty cycle includes:

determining, by the comparison sub-circuit, whether the first target frequency control word is equal to the second target frequency control word; and if the first target frequency control word is not equal to the second target frequency control word, outputting, by the comparison sub-circuit, the first target frequency control word and the second target frequency control word to the pulse generation sub-circuit, and outputting a first control signal to the output selection sub-circuit; generating, by the pulse generation sub-circuit, the target pulse signal in response to the first target frequency control word and the second target frequency control word, and outputting the target pulse signal to the output selection sub-circuit; and outputting, by the output selection sub-circuit in response to the first control signal, the target pulse signal generated by the pulse generation sub-circuit; and the method further includes: if the first target frequency control word is equal to the second target frequency control word, outputting, by the comparison sub-circuit, a second control signal to the output selection sub-circuit, and outputting, by the output selection sub-circuit in response to the second control signal, a target pulse signal whose duty cycle is 1.

Optionally, the control word providing circuit includes a controller and a memory, the memory stores a plurality of control word pairs, each of the control word pairs includes a first candidate frequency control word and a second candidate frequency control word, and a ratio of the first candidate frequency control word to the second candidate frequency control word comprised in any one of the control word pairs is different from a ratio of the first candidate frequency control word to the second candidate frequency control word comprised in any other control word pair; and generating, by the control word providing circuit, the first target frequency control word and the second target frequency control word based on the target duty cycle includes:

determining, by the controller based on the target duty cycle, a target control word pair from the plurality of control word pairs stored in the memory, wherein a ratio of a first candidate frequency control word to a second candidate frequency control word included in the target control word pair is the target duty cycle; and determining, by the controller, the first candidate frequency control word included in the target control word pair as the first target frequency control word and determining the second candidate frequency control word included in the target control word pair as the second target frequency control word.

Optionally, the memory has a plurality of storage areas, each of the storage areas stores one control word pair, and control word pairs stored in different storage areas are different; and determining, by the controller based on the target duty cycle, the target control word pair from the plurality of control word pairs stored in the memory includes:

determining, by the controller based on the target duty cycle, an address of a target storage area from the plurality of storage areas based on the target duty cycle, and obtaining the target control word pair from the target storage area based on the address of the target storage area, wherein the address A of the target storage area satisfies: $A=A1+D/r$, A1 is a reference address, D is the target duty cycle, and r is a resolution of the target duty cycle.

Optionally, the pulse generation sub-circuit includes: an initial pulse generation module and a target pulse generation module; and generating, by the pulse generation sub-circuit, the target pulse signal in response to the first target frequency control word and the second target frequency control word includes:

generating, by the initial pulse generation module, a plurality of initial pulses and outputting the plurality of initial pulses to the target pulse generation module, wherein a phase difference between any two adjacent initial pulses is the same; and generating, by the target pulse generation module, the target pulse signal whose duty cycle is the target duty cycle based on the plurality of initial pulses, and the first target frequency control word and the second target frequency control word that are output by the comparison sub-circuit.

According to another aspect, an electronic device is provided. The electronic device includes a controlled circuit and the PWM circuit according to the foregoing aspect; and the PWM circuit is connected to the controlled circuit, and the controlled circuit is configured to operate in response to a target pulse signal output by the PWM circuit.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

FIG. 10 is a schematic diagram of target pulse signals corresponding to different target duty cycles according to an embodiment of the present disclosure;

FIG. 11 is a flowchart of a method for PWM according to an embodiment of the present disclosure.

DETAILED DESCRIPTION

In order to make the objectives, technical solutions and advantages of the present disclosure clearer, implementations of the present disclosure will be further described in detail below in combination with the accompanying drawings.

In related arts, a PWM circuit usually includes a counter control unit, which may be configured to control the frequency and duty cycle of a pulse signal generated by the PWM circuit. With the development of communication technologies, a controlled circuit can now be flexibly controlled by an analog circuit providing analog signals. For example, the analog circuit may include a resistor, a capacitor, an inductor, and the like. Alternatively, the controlled circuit can be flexibly controlled by a PWM circuit providing digital pulse signals based on PWM technologies. For example, the PWM technologies include random PWM, sinusoidal PWM (SPWM), equal pulse width PWM, and the like.

However, the counter control unit has a limited counting range, limiting the frequency and duty cycle of the generated pulse signal. Consequently, the PWM circuit has poor flexibility in generating pulse signals. For example, when the controlled circuit is controlled by the analog circuit providing analog signals, less reliable control is achieved due to the poor anti-interference capability of the analog signals. In addition, because the duty cycle and frequency of the digital pulse signal generated by the current PWM circuit are generally controlled by a counter, and the counter has a limited counting range, the duty cycle and frequency of the generated digital pulse signal are limited, leading to poor flexibility and reliability in controlling the controlled circuit.

An embodiment of the present disclosure provides a PWM circuit, which can flexibly generate target frequency control words based on a desired target duty cycle without considering the power consumption and area, and can reliably generate a target pulse signal with the desired target duty cycle based on the target frequency control words. The PWM circuit is flexible and reliable in generating the pulse signal, and accordingly, has an efficient working guarantee for a high-performance electronic device equipped with the PWM circuit.

Figure 1:
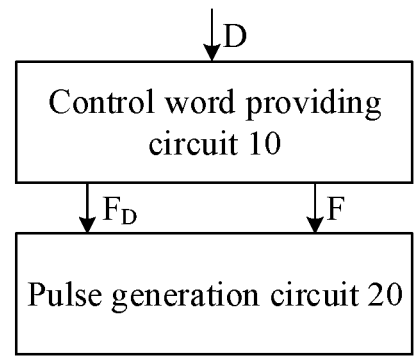
FIG. 1 is a schematic structural diagram of a PWM circuit according to an embodiment of the present disclosure.

FIG. 1 is a schematic structural diagram of a PWM circuit according to an embodiment of the present disclosure. As shown in FIG. 1, the circuit may include a control word providing circuit 10 and a pulse generation circuit 20, and the control word providing circuit 10 may be connected to the pulse generation circuit 20.

The control word providing circuit 10 may be configured to: obtain a target duty cycle, generate a first target frequency control word and a second target frequency control word based on the target duty cycle, and output the first target frequency control word and the second target frequency control word to the pulse generation circuit 20.

In this embodiment of the present disclosure, a ratio of the first target frequency control word to the second target frequency control word may be the target duty cycle. To be specific, referring to FIG. 1, it is assumed that the target duty cycle is indicated by D, the first target frequency control word is indicated by $F_D$, and the second target frequency control word is indicated by F (the same characters are used in all the following embodiments). In this case, the first target frequency control word $F_D$ and the second target frequency control word F generated by the control word providing circuit 10 may satisfy:

$$D = F_D/F \qquad (1)$$

The pulse generation circuit 20 may be configured to output, in response to the first target frequency control word and the second target frequency control word, a target pulse signal whose duty cycle is the target duty cycle. Optionally, first target frequency control word $F_D$ and the second target frequency control word F generated by the control word providing circuit 10 may both be positive integers.

In conclusion, this embodiment of the present disclosure provides a PWM circuit. The PWM circuit includes the control word providing circuit and the pulse generation circuit. The control word providing circuit can flexibly generate, based on the obtained target duty cycle, two target frequency control words with a ratio of the target duty cycle, and the pulse generation circuit can reliably generate the target pulse signal with the target duty cycle based on the two target frequency control words. In this way, the PWM circuit is more flexible in generating the pulse signal than PWM circuits in related technologies.

Optionally, the target duty cycle D obtained by the control word providing circuit 10 may be input by a user, and the target duty cycle D may be less than 1, that is, the relationship between the generated first target frequency control word $F_D$ and second target frequency control word F may satisfy: $1 \leq F_D < F$. Certainly, the target duty cycle D may alternatively be equal to 1, that is, the generated first target frequency control word $F_D$ and second target frequency control word F may alternatively be equal.

Figure 2:
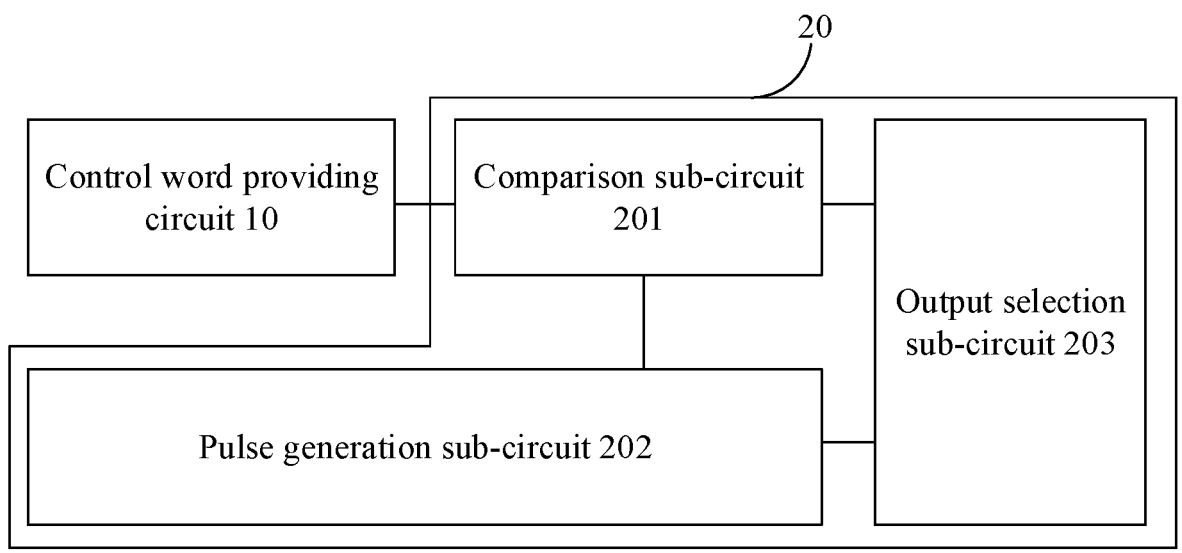
FIG. 2 is a schematic structural diagram of another PWM circuit according to an embodiment of the present disclosure.

Optionally, FIG. 2 is a schematic structural diagram of another PWM circuit according to an embodiment of the present disclosure. As shown in FIG. 2, a pulse generation circuit 20 may include: a comparison sub-circuit 201, a pulse generation sub-circuit 202, and an output selection sub-circuit 203.

The comparison sub-circuit 201 may be respectively connected to a control word providing circuit 10, the pulse generation sub-circuit 202, and the output selection sub-circuit 203. The control word providing circuit 10 may output a first target frequency control word $F_D$ and a second target frequency control word F to the comparison sub-circuit 201 included in the pulse generation circuit 20, that is, the comparison sub-circuit 201 may be configured to receive the first target frequency control word $F_D$ and the second target frequency control word F.

The comparison sub-circuit 201 may be further configured to determine whether the first target frequency control word $F_D$ is equal to the second target frequency control word F. If the first target frequency control word $F_D$ is not equal to the second target frequency control word F (that is, $F_D \neq F$), the comparison sub-circuit 201 may output the first target frequency control word $F_D$ and the second target frequency control word F to the pulse generation sub-circuit 202 and output a first control signal to the output selection sub-circuit 203. If the first target frequency control word $F_D$ is equal to the second target frequency control word F (that is, $F_D = F$), the comparison sub-circuit 201 may output a second control signal to the output selection sub-circuit 203.

For example, the comparison sub-circuit 201 may be a comparator. After receiving the first target frequency control word $F_D$ and the second target frequency control word F, the comparison sub-circuit 201 may determine whether the first target frequency control word $F_D$ is equal to the second target frequency control word F by comparing values of the first target frequency control word $F_D$ and the second target frequency control word F.

Still referring to FIG. 2, the pulse generation sub-circuit 202 may be further connected to the output selection sub-circuit 203, and the pulse generation sub-circuit 202 may be configured to: generate a target pulse signal in response to the received first target frequency control word $F_D$ and second target frequency control word F, and output the target pulse signal to the output selection sub-circuit 203.

The output selection sub-circuit 203 may be configured to output, in response to the first control signal output by the comparison sub-circuit 201, the target pulse signal generated by the pulse generation sub-circuit 202, that is, the target pulse signal is generated by the pulse generation sub-circuit 202 when the target duty cycle D is not 1. The output selection sub-circuit 203 may be configured to output a target pulse signal whose duty cycle is 1 (that is, a pulse signal without a falling edge) in response to the first control signal output by the comparison sub-circuit 201.

That is, when receiving the first control signal, the output selection sub-circuit 203 may determine $F_D \neq F$. In this case, the output selection sub-circuit 203 may select and output the target pulse signal generated by the pulse generation sub-circuit 202. The output selection sub-circuit 203 may determine $F_D = F$ when receiving the second control signal. In this case, the output selection sub-circuit 203 may directly output the target pulse signal whose duty cycle is 1. Optionally, the output selection sub-circuit 203 may be a data selector (multiplexer, MUX).

Figure 3:
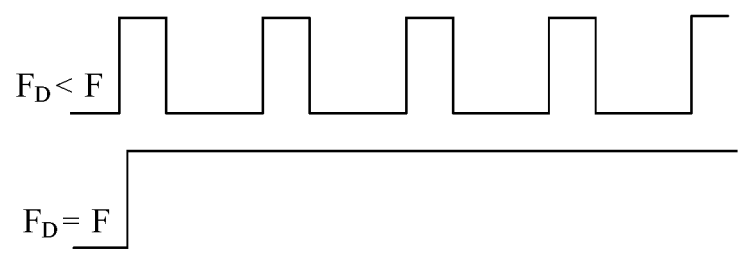
FIG. 3 is a schematic diagram of a target pulse signal according to an embodiment of the present disclosure.

For example, FIG. 3 is a schematic diagram of two output target pulse signals whose target duty cycles D are respectively 1 (that is, $F_D = F$) and less than 1 (that is, $F_D < F$) according to an embodiment of the present disclosure.

It should be noted that in order to drive the PWM circuit to operate normally, the PWM circuit may further include a power supply module for supplying power to the circuits included in the PWM circuit, and the power supply module may be connected to a direct current (DC) power supply terminal capable of providing a power signal. Optionally, the target pulse signal whose duty cycle is 1 output by the output selection sub-circuit 203 may be a DC power signal output by the DC power supply terminal.

Because it is not necessary to generate the target pulse signal based on the frequency control words when the target duty cycle D is 1, the comparison sub-circuit 201 is provided to output the control signal to the output selection sub-circuit 203 based on the target duty cycle D, such that the output selection sub-circuit 203 determines whether to select, based on the control signal, and output the target pulse signal generated by the pulse generation sub-circuit 202 or directly output the pulse signal whose duty cycle is 1. The power consumption of the pulse generation sub-circuit 202 is effectively reduced, that is, the power consumption of the pulse generation circuit 20 is reduced, while ensuring reliable output of the pulse signal based on the target duty cycle D.

Figure 4:
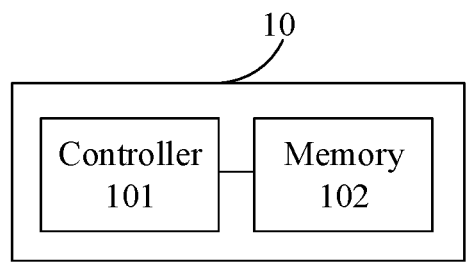
FIG. 4 is a schematic structural diagram of a control word providing circuit according to an embodiment of the present disclosure.

Optionally, FIG. 4 is a schematic structural diagram of a control word providing circuit according to an embodiment of the present disclosure. As shown in FIG. 4, the control word providing circuit 10 may include a controller 101 and a memory 102.

The memory 102 may store a plurality of control word pairs, each of the control word pairs may include a first candidate frequency control word and a second candidate frequency control word, and a ratio of the first candidate frequency control word to the second candidate frequency control word included in each of the control word pairs may not be equal. Optionally, the first candidate frequency control word and the second candidate frequency control word included in each of the control word pairs may both be positive integers.

The controller 101 may be connected to the memory 102, and the controller 101 may be configured to determine a target control word pair from the plurality of control word pairs based on the target duty cycle D. A ratio of a first candidate frequency control word to a second candidate frequency control word included in the target control word pair may be the target duty cycle D.

The controller 101 may further be configured to: determined the first candidate frequency control word included in the target control word pair as the first target frequency control word $F_D$, and determine the second candidate frequency control word included in the target control word pair as the second target frequency control word F.

In an optional implementation, the controller 101 may traverse the plurality of stored control word pairs, to determine the target control word pair whose ratio is the target duty cycle D.

Figure 5:
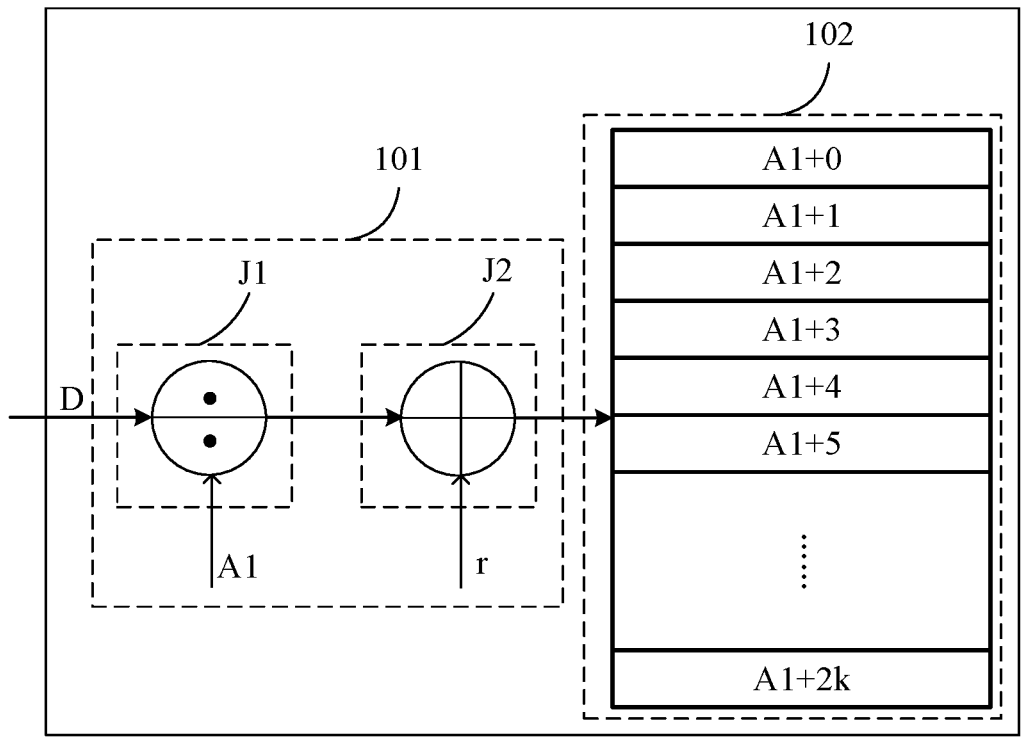
FIG. 5 is a schematic structural diagram of another control word providing circuit according to an embodiment of the present disclosure.

In another optional implementation, the memory 102 may have a plurality of storage areas, as shown in FIG. 5. For example, the memory 102 shown in FIG. 5 has a total of 2k+1 storage areas, that is, 2k memory bytes. Addresses of the 2k+1 storage areas may be A1+0 to A1+2k, respectively, wherein A1 is a reference address.

The reference address may also be referred to as a pre-assigned starting address of the first storage area of the plurality of storage areas. Each of the storage areas may store one control word pair, and control word pairs stored in the storage areas may be different, that is, duty cycles obtained based on the control word pairs stored in different storage areas are different.

The controller 101 may be configured to: determine an address of a target storage area from the plurality of storage areas based on the target duty cycle D, and obtain the target control word pair from the target storage area based on the address of the target storage area. That is, the controller 101 may first determine, based on the target duty cycle D, the address of the target storage area in which the target control word pair is stored, and then directly read the first target frequency control word $F_D$ and the second target frequency control word F from the target storage area.

In this embodiment of the present disclosure, the address A of the target storage area may satisfy:

$$A = A1 + D/r \tag{2}$$

D is the target duty cycle and r is a resolution of the target duty cycle. The resolution of the target duty cycle is the minimum value of the target duty cycle of the target pulse signal generated by the PWM circuit, r in formula (2) may be the minimum value of the resolution of the target duty cycle, and r may be pre-stored in the control word providing circuit 10.

In order to calculate the address of the target storage area based on the formula (2), for example, referring to FIG. 5, the controller 101 may further include a divider J1 and an adder J2. After obtaining the target duty cycle D, the controller 101 may calculate a ratio D/r of the target duty cycle D to the resolution r through the divider J1, and calculate a sum of the reference address A1 and the ratio D/r through the adder J2, so as to calculate the address of the target storage area where the target control word pair is stored, and obtain the target control word pair (the first target frequency control word $F_D$ and the second target frequency control word F shown in FIG. 5) and output the target control word pair to the comparison sub-circuit 201. Determining the first target frequency control word $F_D$ and the second target frequency control word F through this implementation can improve the reliability and efficiency of determining the first target frequency control word $F_D$ and the second target frequency control word F.

It should be noted that if the controller 101 cannot determine, in the memory 102, the first target frequency control word $F_D$ and the second target frequency control word F with the ratio of the target duty cycle D, the controller 101 can output a pair of default frequency control words to the pulse generation circuit 20, and the pulse generation circuit 20 generates and outputs a pulse signal based on the default frequency control words. Optionally, the default frequency control word may be pre-stored in the control word providing circuit 10 (that is, the controller 101). Further, the control word providing circuit 10 may also issue an alarm alert when the first target frequency control word $F_D$ and the second target frequency control word F cannot be determined, such that the user pays attention to the input of the target duty cycle D. For example, the control word providing circuit 10 may further include a buzzer, and the alarm alert may be an audible alarm alert.

Because the control word providing circuit 10 in the above embodiment searches and determines the first target frequency control word $F_D$ and the second target frequency control word F based on the target duty cycle D, the control word providing circuit 10 may also be referred to as a frequency control word lookup table (DF lookup table), and the DF lookup table may be the memory and controller shown in FIG. 5, or the DF lookup table may be a decoder. Certainly, determining the first target frequency control word $F_D$ and the second target frequency control word F is not limited to the two optional implementations described in the above embodiment. For example, the control word providing circuit 10 may have a built-in algorithm for calculating the frequency control words based on the target duty cycle. After obtaining the target duty cycle, the control word providing circuit 10 may directly substitute the target duty cycle into the algorithm to calculate the corresponding frequency control words.

It should be noted that, as described above, the control word providing circuit 10, the comparison sub-circuit 201 and the output selection sub-circuit 203 may be composed of hardware, that is, may be hardware circuits; or may be virtual circuits (for example, processing chips) configured with code programs. This is not limited in the embodiments of the present disclosure. If the control word providing circuit 10 is a virtual circuit configured with a code program, if the control word providing circuit 10 cannot find the first target frequency control word $F_D$ and the second target frequency control word F with the ratio of the target duty cycle D, the control word providing circuit 10 may call a default program to run, wherein the default program may be pre-stored in the control word providing circuit 10.

Figure 6:
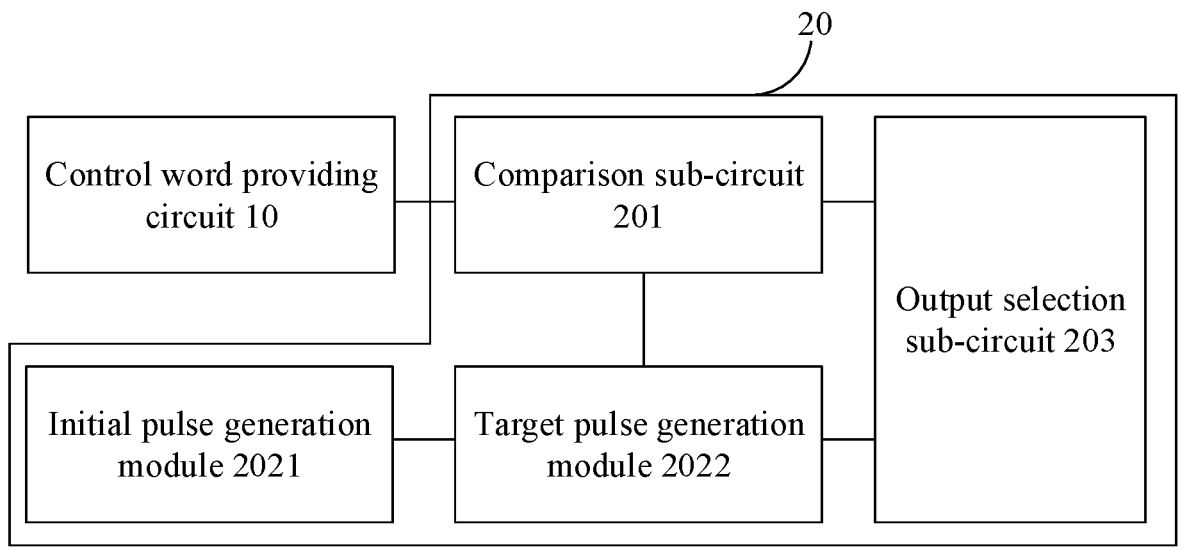
FIG. 6 is a schematic structural diagram of another PWM circuit according to an embodiment of the present disclosure.

Optionally, FIG. 6 is a schematic structural diagram of another PWM circuit according to an embodiment of the present disclosure. As shown in FIG. 6, a pulse generation sub-circuit 202 may include an initial pulse generation module 2021 and a target pulse generation module 2022.

The initial pulse generation module 2021 may be connected to the target pulse generation module 2022, and the target pulse generation module 2022 may further be respectively connected to a comparison sub-circuit 201 and an output selection sub-circuit 203.

The initial pulse generation module 2021 may be configured to generate a plurality of initial pulses and output the plurality of initial pulses to the target pulse generation module 2022, wherein each initial pulse has a same period and frequency, and a phase difference or time interval Δ between any two adjacent initial pulses is the same.

Figure 7:
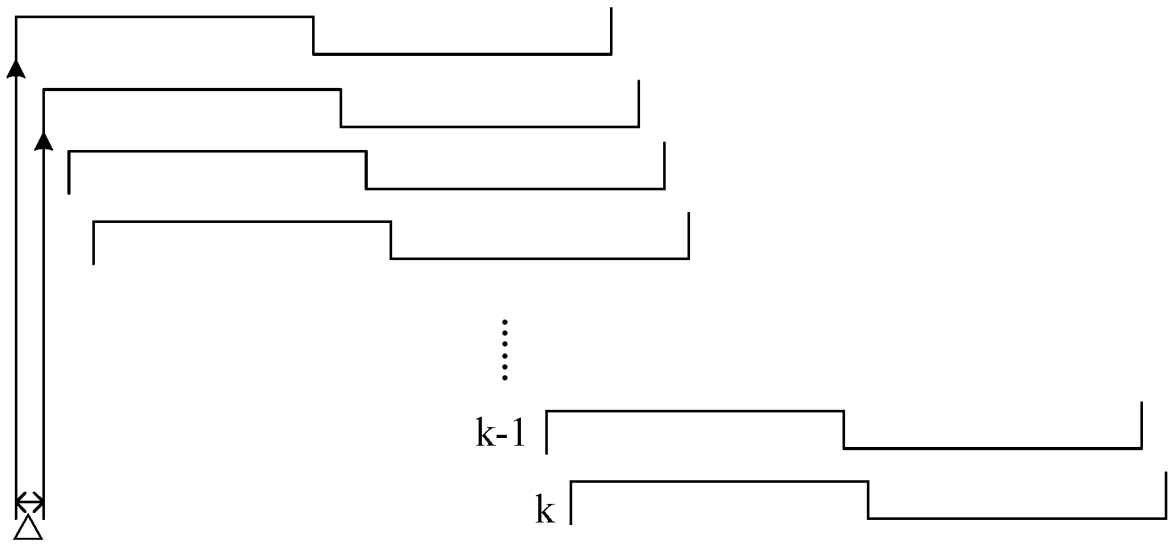
FIG. 7 is a schematic diagram of an initial pulse generated by an initial pulse generation module according to an embodiment of the present disclosure.

For example, the initial pulse generation module 2021 generates a total of k initial pulses. FIG. 7 is a schematic diagram of the plurality of initial pulses. The phase difference Δ between any two adjacent initial pulses may satisfy:

$$\Delta = T/k = 1/k*f \quad (3)$$

k is a quantity of the initial pulses, T is the period of each initial pulse, and f is the frequency of each initial pulse. Correspondingly, the initial pulse generation module 2021 may alternatively be referred to as a k-inputs circuit.

It should be noted that the resolution r of the target duty cycle may satisfy:

$$r = 1/F \geq 1/(\max F) = 1/2k \quad (4)$$

It can be learned from formula (4) that each second target frequency control word F corresponds to a resolution r, and the minimum value of r pre-stored may be 1/2k. Larger k indicates smaller r and better resolution (that is, the minimum value of the target duty cycle is smaller). The resolution may be measured in unit of resolution granularity. For example, assuming k is 256, the resolution r of the target duty cycle D may be 0.195%.

Optionally, the quantity k of initial pulses that can be generated by the initial pulse generation module 2021 may be preset in the initial pulse generation module 2021, for example, may be set in the initial pulse generation module 2021 by a user (for example, a developer) during production. Further, k may be 2 to the $i^{th}$ power, and i may be an integer greater than or equal to 1. For example, k may be 16, 32, 128, or the like.

The target pulse generation module 2022 may be configured to: generate, based on the plurality of initial pulses, the first target frequency control word $F_D$ and the second target frequency control word F, a target pulse signal whose duty cycle is the target duty cycle D and output the target pulse signal to the output selection sub-circuit 203.

Figure 8:
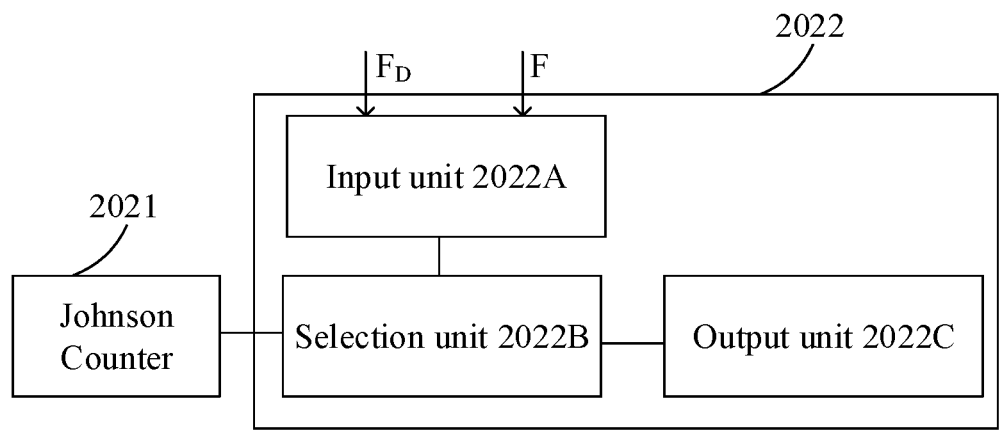
FIG. 8 is a schematic structural diagram of a pulse generation sub-circuit according to an embodiment of the present disclosure.

Optionally, FIG. 8 is a schematic structural diagram of a pulse generation sub-circuit according to an embodiment of the present disclosure. As shown in FIG. 8, the initial pulse generation module 2021 may include a Johnson Counter. Because the Johnson Counter can generate a larger quantity of initial pulses, that is, k is larger, the target duty cycle can have a better resolution and greater applicability.

Still referring to FIG. 8, a target pulse generation module 2022 may include: an input unit 2022A, a selection unit 2022B, and an output unit 2022C.

The input unit 2022A may be respectively connected to the control word providing circuit 10 and the selection unit 2022B, and the input unit 2022A may be configured to output a selection control signal to the selection unit 2022B based on a first target frequency control word and a second target frequency control word (for example, a first target frequency control word $F_D$ and a second target frequency control word F shown in FIG. 8).

The selection unit 2022B may further be respectively connected to the initial pulse generation module 2021 and the output unit 2022C, and the selection unit 2022B may be configured to: select an initial candidate pulse from a plurality of initial pulses in response to the selection control signal and output the initial candidate pulse to the output unit 2022C.

The output unit 2022C may further be connected to an output selection sub-circuit 203, and the output unit 2022C may be configured to: adjust the initial candidate pulse to a target pulse signal whose duty cycle is the target duty cycle, and output the target pulse signal to the output selection sub-circuit 203.

Figure 9:
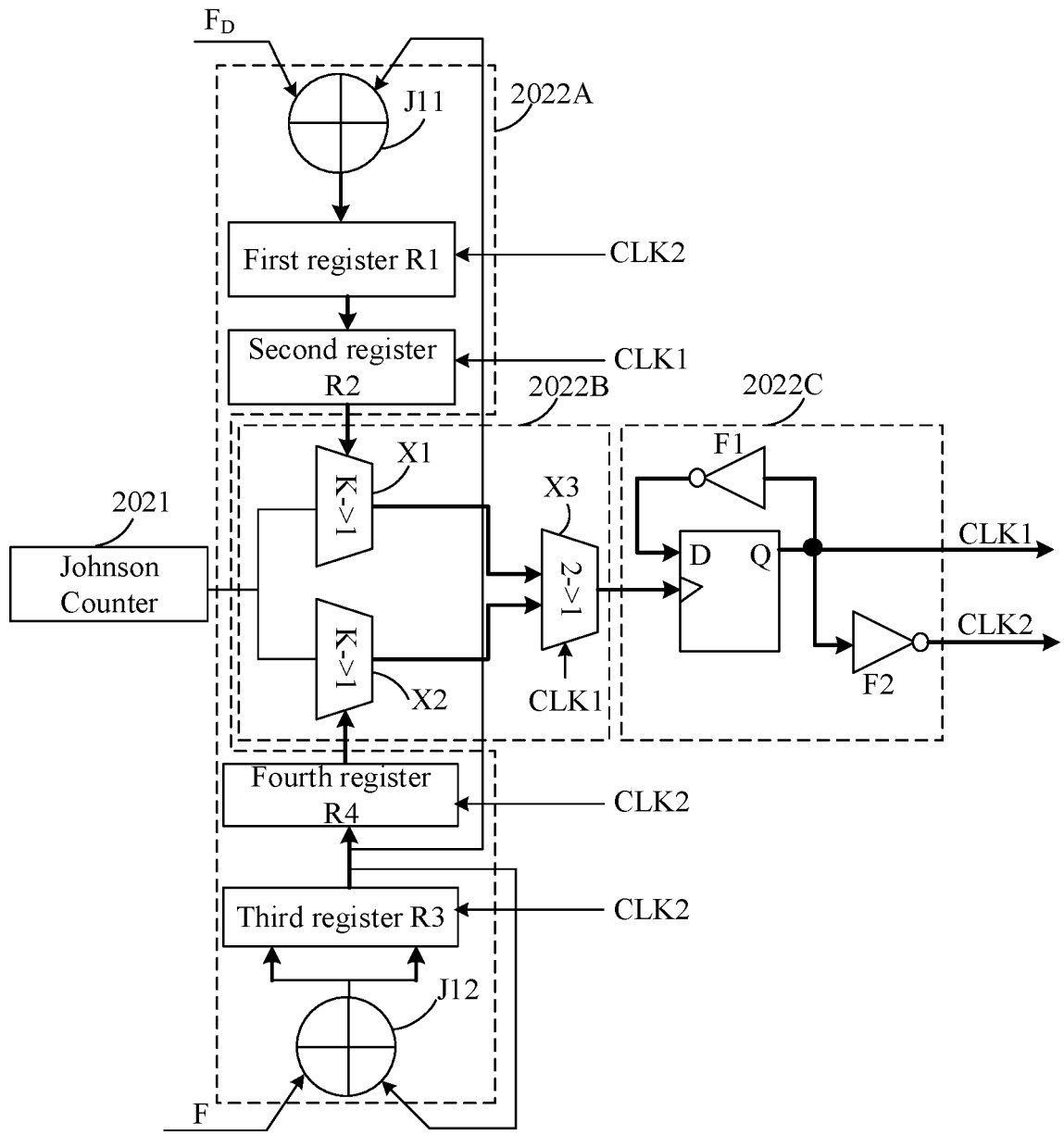
FIG. 9 is a schematic structural diagram of another pulse generation sub-circuit according to an embodiment of the present disclosure.

Optionally, FIG. 9 is a schematic structural diagram of another pulse generation sub-circuit according to an embodiment of the present disclosure. As shown in FIG. 9, an input unit 2022A may include: a first register R1, a second register R2, a third register R3, a fourth register R4, a first adder J11, and a second adder J12. A selection unit 2022B may include: a first selector X1, a second selector X2 and a third selector X3. An output unit 2022C may include: a D flip-flop, a first inverter F1 and a second inverter F2.

The first adder J11 and the second adder J12 may be connected to a control word providing circuit 10 (not shown in FIG. 9) and the third register R3, respectively, and the first adder J11, the first register R1, the second register R2, and the first selector X1 are connected in sequence, and the second adder J12, the third register R3, the fourth register R4, and the second selector X2 are connected in sequence. In addition, the second register R2 may further be connected to a first clock signal terminal CLK1, and the first register R1, the third register R3 and the fourth register R4 may further be connected to a second clock signal terminal CLK2.

The first selector X1 and the second selector X2 may further be connected to the initial pulse generation module 2021 and the third selector X3, respectively, and the third selector X3 may further be connected to the first clock signal terminal and a first input terminal of the D flip-flop CLK1.

A second input terminal of the D flip-flop may be connected to an output terminal of the first inverter F1, and an input terminal of the first inverter F1 and an input terminal of the second inverter F2 may be connected to an output terminal of the D flip-flop. In addition, referring to FIG. 9, the output terminal of the D flip-flop may be used as the output of the first clock signal terminal CLK1, the output terminal of the second inverter F2 may be used as the output of the second clock signal terminal CLK2, and clock signals provided by the first clock signal terminal CLK1 and the second clock signal terminal CLK2 are only opposite in phase and have the same frequency.

For example, referring to FIG. 7 and FIG. 9, assuming that the initial pulse generation module 2021 generates a total of k initial pulses, both the first selector X1 and the second selector X2 may be the selector k->1 shown in FIG. 9 (that is, select one initial pulse from the k initial pulses). Because the third selector X3 is configured to select one from two, referring to FIG. 9, the third selector X3 may be the selector 2->1 (that is, select one initial pulse from two initial pulses). The principle of generating the target pulse signal by the pulse generation sub-circuit 202 is described with reference to FIG. 9.

For example, the first adder J11 may add the first target frequency control word $F_D$ and the highest significant bit (for example, 5 bits) stored in the third register R3, and then store a summation result into the first register R1 at a rising edge of a second clock signal provided by the second clock signal terminal CLK2 connected to the first register R1; or the first adder J11 may add the first target frequency control word $F_D$ and all information stored in the third register R3, and then store a summation result into the first register R1 at the rising edge of the second clock signal provided by the second clock signal terminal CLK2 connected to the first register R1. At a rising edge of a first clock signal provided by the first clock signal terminal CLK1 connected to the second register R2, that is, at a rising edge of a next first clock signal, the highest significant bit stored in the first register R1 is stored in the second register R2 and used as a selection signal of the first selector X1. Accordingly, the first selector X1 may then select, in response to the selection signal, an initial candidate pulse from the k initial pulses as the output signal of the first selector X1 and output the initial candidate pulse to the third selector X3.

Similarly, the second adder J12 may add the second target frequency control word F and the highest significant bit stored in the third register R3, and then store the summation result into the fourth register R4 at the rising edge of the second clock signal provided by the second clock signal terminal CLK2 connected to the third register R3. Alternatively, the second adder J12 may add the second target frequency control word F and all information stored in the third register R3, and then store a summation result into the third register R3 at the rising edge of the second clock signal provided by the second clock signal terminal CLK2 connected to the third register R3. At the rising edge of the second clock signal provided by the second clock signal terminal CLK2 connected to the fourth register R4, that is, at a rising edge of a next second clock signal, the information stored in the third register R3 is stored in the fourth register R4 and used as the selection signal of the second selector X2. Accordingly, the second selector X2 may then select, in response to the selection signal, an initial candidate pulse from the k initial pulses as the output signal of the second selector X2 and output the initial candidate pulse to the third selector X3.

Further, at the rising edge of the first clock signal provided by the first clock signal terminal CLK1 to which the third selector X3 is connected, the third selector X3 may select one of the output signal from the first selector X1 and the output signal from the first selector X2 as an output signal of the third selector X3 and output it to the D flip-flop, to serve as an input clock signal of the D flip-flop. Then, a clock signal output from the output terminal of the D flip-flop or the output terminal of the second inverter F2 may be used as a final output signal. In this way, the target pulse signal is generated.

To be specific, the Johnson Counter first outputs k initial pulses, the second selector X2 selects, during initial operation, the first initial pulse generated by the Johnson Counter, and the third selector X3 selects the initial pulse output by the second selector X2 and sends the initial pulse to the output unit 2022C. The first clock signal provided by the first clock signal terminal CLK1 and the second clock signal provided by the second clock signal terminal CLK2 both flip and the first edge appears. In this case, the first selector X1 selects the $(1+F_D)^{th}$ initial pulse and the third selector X3 starts selecting the output of the first selector X1 because the first clock signal flips. When the rising edge of the $(1+F_D)^{th}$ initial pulse arrives, the output unit 2022C flips again and a second edge appears. Then, the second selector X2 selects the $(1+F)^{th}$ initial pulse again, and the third selector X3 selects, because the first clock signal flips, the initial pulse output by the second selector X2. When the rising edge of the $(1+F)^{th}$ initial pulse arrives, the output unit 2022C flips again and a third edge appears. By analogy, the target pulse signal is generated.

Optionally, the selection signal output by the fourth register R4 may be used as a falling edge selection signal, the selection signal output by the second register R2 may be used as a rising edge selection signal, and the signal fed back by the third register R3 to each adder may be used to control period switching of the generated clock signal. Accordingly, the selection signal output by the fourth register R4 may be referred to as the falling edge control word, and the selection signal output by the second register R2 may be referred to as the rising edge control word. That is, the first target frequency control word $F_D$ may be referred to as the rising edge control word (that is, an upper path control word), and the second target frequency control word F may be referred to as the falling edge control word (that is, a lower path control word).

It should be noted that the pulse generation sub-circuit 202 may also be referred to as a Time-Average Frequency Direct Period Synthesis (TAF-DPS) circuit. Only the pulse direct synthesis principle of the TAF-DPS circuit may be used to generate the target pulse signal, without the timeaverage-frequency principle (that is, the output signal is controlled to have only one period). Accordingly, the first target frequency control word and the second target frequency control word described above in the embodiments of the present disclosure may both be positive integers, that is, do not contain fractional parts. The third register R3 may store a fixed value (for example, 0) by default before operation, data accumulated each time may be stored in the third register R3.

Optionally, the period T0 of the target pulse signal finally output by the TAF-DPS circuit may satisfy:

$$T0=F^*\Delta=(F^*T)/k=F/kf \qquad (5)$$

$2 \leq F \leq 2k$, T is the period of each initial pulse, and f is the frequency of each initial pulse.

FIG. 10 is a schematic diagram of target pulse signals with the target duty cycle D=1/2, D=1/3 or D=1/4 according to an embodiment of the present disclosure. It should be noted that target signals with different target duty cycle may be obtained by changing the first target frequency control word $F_D$ or the second target frequency control word F. Changing the first target frequency control word $F_D$ without changing the second target frequency control word F may be referred to as adjusting only the period without changing the pulse width. Changing the second target frequency control word F without changing the first target frequency control word $F_D$ may be referred to as adjusting only the pulse width without changing the period.

For example, it is assumed that the first target frequency control word $F_D$ is fixed as $F_D=2$. If the target pulse signal with D=1/2 is needed, the generated second target frequency control word F may be F=4; if the target pulse signal with D=1/3 is needed, the generated second target frequency control word may be F=6; or if the target pulse signal with D=1/4 is needed, the generated second target frequency control word F may be F=8.

Similarly, it is assumed that the second target frequency control word F is fixed as F=100. If the target pulse signal with D=1/2 is needed, the generated first target frequency control word $F_D$ may be $F_D=50$; if the target pulse signal with D=1/3 is needed, the generated first target frequency control word $F_D$ may be $F_D=33$; or if the target pulse signal with D=1/4 is needed, the generated first target frequency control word $F_D$ may be $F_D=25$.

The PWM circuit provided in the embodiments of the present disclosure has the advantages of high efficiency, low power consumption and high resolution, and may be integrated in various chips as a reusable circuit to control the controlled circuit.

In conclusion, this embodiment of the present disclosure provides a PWM circuit. The PWM circuit includes the control word providing circuit and the pulse generation circuit. The control word providing circuit can flexibly generate, based on the obtained target duty cycle, two target frequency control words with a ratio of the target duty cycle, and the pulse generation circuit can reliably generate the target pulse signal with the target duty cycle based on the two target frequency control words. In this way, the PWM circuit is more flexible in generating the pulse signal than PWM circuits in related technologies.

FIG. 11 is a flow chart of a method for PWM according to an embodiment of the present disclosure, which may be used in the PWM circuit as shown in any of FIG. 1, FIG. 2, and FIG. 6. As shown in FIG. 11, the method may include:

In step 1101, a control word providing circuit obtains a target duty cycle, generates a first target frequency control word and a second target frequency control word based on the target duty cycle, and outputs the first target frequency control word and the second target frequency control word to a pulse generation circuit.

A ratio of the first target frequency control word to the second target frequency control word may be the target duty cycle.

In step 1102, the pulse generation circuit outputs, in response to the first target frequency control word and the second target frequency control word, a target pulse signal whose duty cycle is the target duty cycle.

In conclusion, this embodiment of the present disclosure provides a method for PWM. In the method, two target frequency control words with the ratio of the target duty cycle may be flexibly generated based on the obtained target duty cycle, and the target pulse signal with the target duty cycle may be flexibly generated based on the two target frequency control words. In this way, in the method for PWM, the pulse signal is generated more flexibly than method for PWMs in related technologies.

It should be noted that optional structures of the circuits included in the PWM circuit, and corresponding optional implementations of steps 1101 and 1102 may be referred to the description of the device side, and details are not be repeated in the method embodiments.

Figure 12:
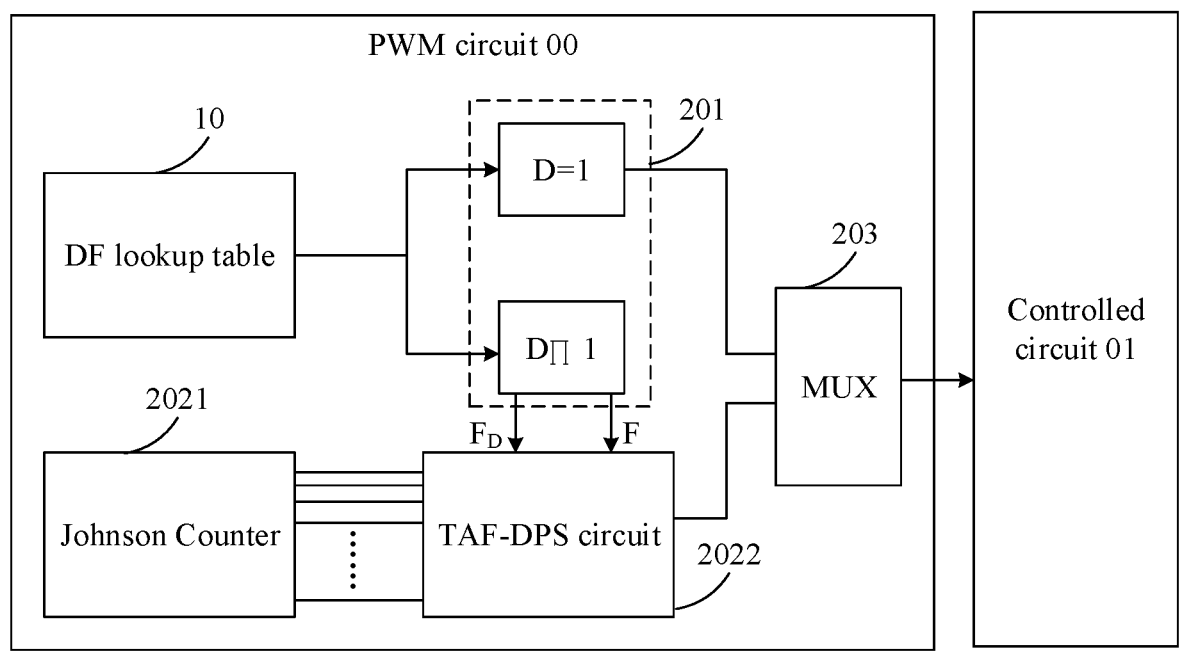
FIG. 12 is a schematic structural diagram of an electronic device according to an embodiment of the present disclosure.

FIG. 12 is a schematic structural diagram of an electronic device according to an embodiment of the present disclosure. As shown in FIG. 12, the electronic device may include a controlled circuit 01, and the PWM circuit 00 shown in any of FIG. 1, FIG. 2, and FIG. 6. The PWM circuit 00 may be connected to the controlled circuit 01, and the controlled circuit 01 may operate in response to a target pulse signal output by the PWM circuit.

For example, FIG. 12 shows an optional structure of the PWM circuit by using an example in which a control word providing circuit 10 included in the PWM circuit 00 is a DF lookup table, a comparison sub-circuit 201 is a comparator, an initial pulse generation module 2021 is a Johnson Counter, a target pulse generation module 2022 is a TAF-DPS circuit, and an output selection sub-circuit 203 is a MUX data selector.

Referring to FIG. 12, in the PWM circuit provided in this embodiment of the present disclosure, the DF lookup table may first generate a first target frequency control word $F_D$ and a second target frequency control word F based on a target duty cycle D and output them to a comparator. The comparator outputs a second control signal to the MUX data selector when determining that the first target frequency control word $F_D$ is equal to the second target frequency control word F, that is, the target duty cycle D is 1. In this case, the MUX data selector may directly output a target pulse signal with the target duty cycle D of 1 to the controlled circuit 01, to drive the controlled circuit 01 to operate. The comparator outputs the first target frequency control word $F_D$ and the second target frequency control word F to the TAF-DPS circuit and outputs a first control signal to the MUX data selector when determining that the first target frequency control word $F_D$ is not equal to the second target frequency control word F, that is, the target duty cycle D is not 1. In this case, the TAF-DPS circuit may generate the target pulse signal with the target duty cycle based on the first target frequency control word $F_D$ and the second target frequency control word F, and the MUX data selector may select the target pulse signal generated by the TAF-DPS circuit and output the target pulse signal to the controlled circuit 01, to drive the controlled circuit 01 to operate.

It should be understood that the term "and/or" in this specification indicates three types of relationships. For example, A and/or B may indicate that A exists alone, A and B coexist, or B exists alone. The character "/" generally indicates that the associated objects are in an "or" relationship.

A person skilled in the art can clearly understand that, for convenience and brevity of description, reference may be made to corresponding processes in the foregoing method embodiments for specific working processes of the circuits, sub-circuits, modules, units, and device included in the PWM circuit. Details are not described herein again.

The foregoing descriptions are merely optional embodiments of the present disclosure and are not intended to limit the present disclosure. Any modification, equivalent replacement, and improvement within the spirit and principle of the present disclosure shall be included within the protection scope of the present disclosure.

What is claimed is:

1. A pulse width modulation (PWM) circuit, wherein the PWM circuit comprises a control word providing circuit and a pulse generation circuit, and the control word providing circuit is connected to the pulse generation circuit;
   the control word providing circuit is configured to: obtain a target duty cycle, generate a first target frequency control word and a second target frequency control word based on the target duty cycle, and output the first target frequency control word and the second target frequency control word to the pulse generation circuit, wherein a ratio of the first target frequency control word to the second target frequency control word is the target duty cycle;
   the pulse generation circuit is configured to output, in response to the first target frequency control word and the second target frequency control word, a target pulse signal whose duty cycle is the target duty cycle;
   the pulse generation circuit comprises a comparison sub-circuit, a pulse generation sub-circuit and an output selection sub-circuit;
   the comparison sub-circuit is respectively connected to the control word providing circuit, the pulse generation sub-circuit and the output selection sub-circuit, the control word providing circuit is configured to output the first target frequency control word and the second target frequency control word to the comparison sub-circuit; and the comparison sub-circuit is configured to: determine whether the first target frequency control word is equal to the second target frequency control word; if the first target frequency control word is not equal to the second target frequency control word, output the first target frequency control word and the second target frequency control word to the pulse generation sub-circuit and output a first control signal to the output selection sub-circuit; and the first target frequency control word is equal to the second target frequency control word, output a second control signal to the output selection sub-circuit;
   the pulse generation sub-circuit is connected to the output selection sub-circuit, and the pulse generation sub-circuit is configured to: generate the target pulse signal and output the target pulse signal to the output selection sub-circuit in response to the first target frequency control word and the second target frequency control word; and
   the output selection sub-circuit is configured to: output, in response to the first control signal, the target pulse signal provided by the pulse generation sub-circuit, and output, in response to the second control signal, a target pulse signal whose duty cycle is 1.

2. The PWM circuit according to claim 1, wherein the control word providing circuit comprises a controller and a memory, the memory stores a plurality of control word pairs, each of the control word pairs comprises a first candidate frequency control word and a second candidate frequency control word, and a ratio of the first candidate frequency control word to the second candidate frequency control word comprised in any one of the control word pairs is different from a ratio of the first candidate frequency control word to the second candidate frequency control word comprised in any other control word pair;
   the controller is connected to the memory, and the controller is configured to determine, based on the target duty cycle, a target control word pair from the plurality of control word pairs stored in the memory, wherein a ratio of a first candidate frequency control word to a second candidate frequency control word comprised in the target control word pair is the target duty cycle; and
   the controller is further configured to: determine the first candidate frequency control word comprised in the target control word pair as the first target frequency control word, and determine the second candidate frequency control word comprised in the target control word pair as the second target frequency control word.

3. The PWM circuit according to claim 2, wherein the memory has a plurality of storage areas, each of the storage areas stores one control word pair, and control word pairs stored in different storage areas are different; and
   the controller is configured to: determine an address of a target storage area from the plurality of storage areas based on the target duty cycle, and obtain the target control word pair from the target storage area based on the address of the target storage area, wherein
   the address A of the target storage area satisfies: $A = A1 + D/r$, A1 is a reference address, D is the target duty cycle, and r is a resolution of the target duty cycle.

4. The PWM circuit according to claim 1, wherein the pulse generation sub-circuit comprises an initial pulse generation module and a target pulse generation module;
   the initial pulse generation module is connected to the target pulse generation module, and the initial pulse generation module is configured to: generate a plurality of initial pulses and output the plurality of initial pulses to the target pulse generation module, wherein a phase difference between any two adjacent initial pulses is the same; and
   the target pulse generation module is further respectively connected to the comparison sub-circuit and the output selection sub-circuit, and the target pulse generation module is configured to: generate the target pulse signal whose duty cycle is the target duty cycle based on the plurality of initial pulses, and the first target frequency control word and the second target frequency control word that are output by the comparison sub-circuit, and output the target pulse signal to the output selection sub-circuit.

5. The PWM circuit according to claim 4, wherein the target pulse generation module comprises: an input unit, a selection unit and an output unit;
   the input unit is respectively connected to the control word providing circuit and the selection unit, and the input unit is configured to output a selection control signal to the selection unit based on the first target frequency control word and the second target frequency control word;

the selection unit is further respectively connected to the initial pulse generation module and the output unit, and the selection unit is configured to: select an initial candidate pulse from the plurality of initial pulses in response to the selection control signal, and output the initial candidate pulse to the output unit; and the output unit is further connected to the output selection sub-circuit, and the output unit is configured to: generate the target pulse signal based on the initial candidate pulse, and output the target pulse signal to the output selection sub-circuit.

6. The PWM circuit according to claim 5, wherein the input unit comprises: a first register, a second register, a third register, a fourth register, a first adder, and a second adder; the selection unit comprises: a first selector, a second selector, and a third selector; and the output unit comprises: a D flip-flop, a first inverter, and a second inverter;

the first adder and the second adder are connected to the control word providing circuit and the third register, respectively, the first adder, the first register, the second register and the first selector are sequentially connected, the second adder, the third register, the fourth register and the second selector are sequentially connected, the second register is further connected to a first clock signal terminal, and the first register, the third register and the fourth register are further respectively connected to a second clock signal terminal;

the first adder is configured to: add the first target frequency control word and information stored in the third register, and store a summation result in the first register at a rising edge of a second clock signal provided by the second clock signal terminal connected to the first register; the second register is configured to: store the summation result stored in the first register at a rising edge of a first clock signal provided by the first clock signal terminal connected to the second register, and output the summation result to the first selector; the second adder is configured to: add the second target frequency control word and the information stored in the third register, and store a summation result in the third register at the rising edge of the second clock signal provided by the second clock signal terminal connected to the third register; and the fourth register is configured to: store the summation result stored in the third register at the rising edge of the first clock signal provided by the first clock signal terminal connected to the fourth register, and output the summation result to the second selector;

the first selector and the second selector are further connected to the initial pulse generation module and the third selector, respectively, and the third selector is further connected to the first clock signal terminal and a first input terminal of the D flip-flop;

the first selector is configured to: select a first candidate pulse from the plurality of initial pulses in response to the summation result output by the second register, and output the first candidate pulse to the third selector; the second selector is configured to: select a second candidate pulse from the plurality of initial pulses in response to the summation result output by the fourth register, and output the second candidate pulse to the third selector; the third selector is configured to: select one of the first candidate pulse and the second candidate pulse as the initial candidate pulse at the rising edge of the first clock signal provided by the first clock signal terminal connected to the third selector, and output the initial candidate pulse to the D flip-flop; and a second input terminal of the D flip-flop is connected to an output terminal of the first inverter, an input terminal of the first inverter and an input terminal of the second inverter are both connected to an output terminal of the D flip-flop, and the D flip-flop is configured to: generate the target pulse signal based on the initial candidate pulse and output the target pulse signal to the output selection sub-circuit.

7. The PWM circuit according to claim 6, wherein both the first target frequency control word and the second target frequency control word are positive integers.

8. The PWM circuit according to claim 7, wherein the control word providing circuit comprises a controller and a memory, the memory has a plurality of storage areas, each of the storage areas stores a control word pair, each of the control word pairs comprises a first candidate frequency control word and a second candidate frequency control word, and a ratio of the first candidate frequency control word to the second candidate frequency control word comprised in any one of the control word pairs is different from a ratio of the first candidate frequency control word to the second candidate frequency control word comprised in any other control word pair;

the controller is connected to the memory, and the controller is configured to: determine an address of a target storage area from the plurality of storage areas based on the target duty cycle, and obtain the target control word pair from the target storage area based on the address of the target storage area; and the controller is further configured to: determine a first candidate frequency control word comprised in the target control word pair as the first target frequency control word, and determine a second candidate frequency control word comprised in the target control word pair as the second target frequency control word, wherein the address A of the target storage area satisfies: $A=A1+D/r$, A1 is a reference address, D is the target duty cycle, and r is a resolution of the target duty cycle.

9. A method for PWM, comprising:

obtaining, by a control word providing circuit, a target duty cycle, generating a first target frequency control word and a second target frequency control word based on the target duty cycle, and outputting the first target frequency control word and the second target frequency control word to a pulse generation circuit, wherein a ratio of the first target frequency control word to the second target frequency control word is the target duty cycle; and outputting, by the pulse generation circuit in response to the first target frequency control word and the second target frequency control word, a target pulse signal whose duty cycle is the target duty cycle;

wherein the pulse generation circuit comprises: a comparison sub-circuit, a pulse generation sub-circuit and an output selection sub-circuit; outputting the first target frequency control word and the second target frequency control word to the pulse generation circuit comprises:

outputting the first target frequency control word and the second target frequency control word to the comparison sub-circuit; and outputting, by the pulse generation circuit in response to the first target frequency control word and the second target frequency control word, the target pulse signal whose duty cycle is the target duty cycle comprises:
  determining, by the comparison sub-circuit, whether the first target frequency control word is equal to the second target frequency control word; and
  if the first target frequency control word is not equal to the second target frequency control word, outputting, by the comparison sub-circuit, the first target frequency control word and the second target frequency control word to the pulse generation sub-circuit, and outputting a first control signal to the output selection sub-circuit; generating, by the pulse generation sub-circuit, the target pulse signal in response to the first target frequency control word and the second target frequency control word, and outputting the target pulse signal to the output selection sub-circuit; and outputting, by the output selection sub-circuit in response to the first control signal, the target pulse signal generated by the pulse generation sub-circuit; and
  the method further comprises: if the first target frequency control word is equal to the second target frequency control word, outputting, by the comparison sub-circuit, a second control signal to the output selection sub-circuit, and outputting, by the output selection sub-circuit in response to the second control signal, a target pulse signal whose duty cycle is 1.

10. The method according to claim 9, wherein the control word providing circuit comprises a controller and a memory, the memory stores a plurality of control word pairs, each of the control word pairs comprises a first candidate frequency control word and a second candidate frequency control word, and a ratio of the first candidate frequency control word to the second candidate frequency control word comprised in any one of the control word pairs is different from a ratio of the first candidate frequency control word to the second candidate frequency control word comprised in any other control word pair; and
  generating, by the control word providing circuit, the first target frequency control word and the second target frequency control word based on the target duty cycle comprises:
  determining, by the controller based on the target duty cycle, a target control word pair from the plurality of control word pairs stored in the memory, wherein a ratio of a first candidate frequency control word to a second candidate frequency control word comprised in the target control word pair is the target duty cycle; and
  determining, by the controller, the first candidate frequency control word comprised in the target control word pair as the first target frequency control word and determining the second candidate frequency control word comprised in the target control word pair as the second target frequency control word.

11. The method according to claim 10, wherein the memory has a plurality of storage areas, each of the storage areas stores one control word pair, and control word pairs stored in different storage areas are different; and
  determining, by the controller based on the target duty cycle, the target control word pair from the plurality of control word pairs stored in the memory comprises:
  determining, by the controller based on the target duty cycle, an address of a target storage area from the plurality of storage areas based on the target duty cycle, and obtaining the target control word pair from the target storage area based on the address of the target storage area, wherein the address A of the target storage area satisfies: $A = A_1 + D/r$, $A_1$ is a reference address, D is the target duty cycle, and r is a resolution of the target duty cycle.

12. The method according to claim 9, wherein the pulse generation sub-circuit comprises an initial pulse generation module and a target pulse generation module; and generating, by the pulse generation sub-circuit, the target pulse signal in response to the first target frequency control word and the second target frequency control word comprises:
  generating, by the initial pulse generation module, a plurality of initial pulses and outputting the plurality of initial pulses to the target pulse generation module, wherein a phase difference between any two adjacent initial pulses is the same; and
  generating, by the target pulse generation module, the target pulse signal whose duty cycle is the target duty cycle based on the plurality of initial pulses, and the first target frequency control word and the second target frequency control word that are output by the comparison sub-circuit.

13. An electronic device, comprising a controlled circuit and a PWM circuit, wherein
  the PWM circuit comprises a control word providing circuit and a pulse generation circuit, and the control word providing circuit is connected to the pulse generation circuit;
  the control word providing circuit is configured to: obtain a target duty cycle, generate a first target frequency control word and a second target frequency control word based on the target duty cycle, and output the first target frequency control word and the second target frequency control word to the pulse generation circuit, wherein a ratio of the first target frequency control word to the second target frequency control word is the target duty cycle;
  the pulse generation circuit is configured to output, in response to the first target frequency control word and the second target frequency control word, a target pulse signal whose duty cycle is the target duty cycle;
  the PWM circuit is connected to the controlled circuit, and the controlled circuit is configured to operate in response to a target pulse signal output by the PWM circuit;
  the pulse generation circuit comprises a comparison sub-circuit, a pulse generation sub-circuit and an output selection sub-circuit;
  the comparison sub-circuit is respectively connected to the control word providing circuit, the pulse generation sub-circuit and the output selection sub-circuit, the control word providing circuit is configured to output the first target frequency control word and the second target frequency control word to the comparison sub-circuit; and the comparison sub-circuit is configured to: determine whether the first target frequency control word is equal to the second target frequency control word; if the first target frequency control word is not equal to the second target frequency control word, output the first target frequency control word and the second target frequency control word to the pulse generation sub-circuit and output a first control signal to the output selection sub-circuit; and the first target frequency control word is equal to the second target frequency control word, output a second control signal to the output selection sub-circuit;
  the pulse generation sub-circuit is connected to the output selection sub-circuit, and the pulse generation sub-circuit is configured to: generate the target pulse signal and output the target pulse signal to the output selection sub-circuit in response to the first target frequency control word and the second target frequency control word; and the output selection sub-circuit is configured to: output, in response to the first control signal, the target pulse signal provided by the pulse generation sub-circuit, and output, in response to the second control signal, a target pulse signal whose duty cycle is 1.

14. The electronic device according to claim 13, wherein the control word providing circuit comprises a controller and a memory, the memory stores a plurality of control word pairs, each of the control word pairs comprises a first candidate frequency control word and a second candidate frequency control word, and a ratio of the first candidate frequency control word to the second candidate frequency control word comprised in any one of the control word pairs is different from a ratio of the first candidate frequency control word to the second candidate frequency control word comprised in any other control word pair;

the controller is connected to the memory, and the controller is configured to determine, based on the target duty cycle, a target control word pair from the plurality of control word pairs stored in the memory, wherein a ratio of a first candidate frequency control word to a second candidate frequency control word comprised in the target control word pair is the target duty cycle; and the controller is further configured to: determine the first candidate frequency control word comprised in the target control word pair as the first target frequency control word, and determine the second candidate frequency control word comprised in the target control word pair as the second target frequency control word.

15. The electronic device according to claim 14, wherein the memory has a plurality of storage areas, each of the storage areas stores one control word pair, and control word pairs stored in different storage areas are different; and the controller is configured to: determine an address of a target storage area from the plurality of storage areas based on the target duty cycle, and obtain the target control word pair from the target storage area based on the address of the target storage area, wherein the address A of the target storage area satisfies: A=A1+ D/r, A1 is a reference address, D is the target duty cycle, and r is a resolution of the target duty cycle.

16. The electronic device according to claim 13, wherein the pulse generation sub-circuit comprises an initial pulse generation module and a target pulse generation module;

the initial pulse generation module is connected to the target pulse generation module, and the initial pulse generation module is configured to: generate a plurality of initial pulses and output the plurality of initial pulses to the target pulse generation module, wherein a phase difference between any two adjacent initial pulses is the same; and the target pulse generation module is further respectively connected to the comparison sub-circuit and the output selection sub-circuit, and the target pulse generation module is configured to: generate the target pulse signal whose duty cycle is the target duty cycle based on the plurality of initial pulses, and the first target frequency control word and the second target frequency control word that are output by the comparison sub-circuit, and output the target pulse signal to the output selection sub-circuit.

17. The electronic device according to claim 16, wherein the target pulse generation module comprises: an input unit, a selection unit and an output unit;

the input unit is respectively connected to the control word providing circuit and the selection unit, and the input unit is configured to output a selection control signal to the selection unit based on the first target frequency control word and the second target frequency control word;

the selection unit is further respectively connected to the initial pulse generation module and the output unit, and the selection unit is configured to: select an initial candidate pulse from the plurality of initial pulses in response to the selection control signal, and output the initial candidate pulse to the output unit; and the output unit is further connected to the output selection sub-circuit, and the output unit is configured to: generate the target pulse signal based on the initial candidate pulse, and output the target pulse signal to the output selection sub-circuit.

18. The electronic device according to claim 17, wherein the input unit comprises: a first register, a second register, a third register, a fourth register, a first adder, and a second adder; the selection unit comprises: a first selector, a second selector, and a third selector; and the output unit comprises: a D flip-flop, a first inverter, and a second inverter;

the first adder and the second adder are connected to the control word providing circuit and the third register, respectively, the first adder, the first register, the second register and the first selector are sequentially connected, the second adder, the third register, the fourth register and the second selector are sequentially connected, the second register is further connected to a first clock signal terminal, and the first register, the third register and the fourth register are further respectively connected to a second clock signal terminal;

the first adder is configured to: add the first target frequency control word and information stored in the third register, and store a summation result in the first register at a rising edge of a second clock signal provided by the second clock signal terminal connected to the first register; the second register is configured to: store the summation result stored in the first register at a rising edge of a first clock signal provided by the first clock signal terminal connected to the second register, and output the summation result to the first selector; the second adder is configured to: add the second target frequency control word and the information stored in the third register, and store a summation result in the third register at the rising edge of the second clock signal provided by the second clock signal terminal connected to the third register; and the fourth register is configured to: store the summation result stored in the third register at the rising edge of the first clock signal provided by the first clock signal terminal connected to the fourth register, and output the summation result to the second selector;

the first selector and the second selector are further connected to the initial pulse generation module and the third selector, respectively, and the third selector is further connected to the first clock signal terminal and a first input terminal of the D flip-flop;

the first selector is configured to: select a first candidate pulse from the plurality of initial pulses in response to the summation result output by the second register, and output the first candidate pulse to the third selector; the second selector is configured to: select a second candidate pulse from the plurality of initial pulses in response to the summation result output by the fourth register, and output the second candidate pulse to the third selector; and the third selector is configured to: select one of the first candidate pulse and the second candidate pulse as the initial candidate pulse at the rising edge of the first clock signal provided by the first clock signal terminal connected to the third selector, and output the initial candidate pulse to the D flip-flop; and a second input terminal of the D flip-flop is connected to an output terminal of the first inverter, an input terminal of the first inverter and an input terminal of the second inverter are both connected to an output terminal of the D flip-flop, and the D flip-flop is configured to: generate the target pulse signal based on the initial candidate pulse and output the target pulse signal to the output selection sub-circuit.

19. The electronic device according to claim 18, wherein both the first target frequency control word and the second target frequency control word are positive integers.

20. The electronic device according to claim 19, wherein the control word providing circuit comprises a controller and a memory, the memory has a plurality of storage areas, each of the storage areas stores a control word pair, each of the control word pairs comprises a first candidate frequency control word and a second candidate frequency control word, and a ratio of the first candidate frequency control word to the second candidate frequency control word comprised in any one of the control word pairs is different from a ratio of the first candidate frequency control word to the second candidate frequency control word comprised in any other control word pair;

the controller is connected to the memory, and the controller is configured to: determine an address of a target storage area from the plurality of storage areas based on the target duty cycle, and obtain the target control word pair from the target storage area based on the address of the target storage area; and the controller is further configured to: determine a first candidate frequency control word comprised in the target control word pair as the first target frequency control word, and determine a second candidate frequency control word comprised in the target control word pair as the second target frequency control word, wherein the address A of the target storage area satisfies: $A=A1+D/r$, A1 is a reference address, D is the target duty cycle, and r is a resolution of the target duty cycle.

* * * * *